(12) United States Patent
Zhu et al.

(10) Patent No.: US 11,793,037 B2
(45) Date of Patent: Oct. 17, 2023

(54) DISPLAY PANEL AND DISPLAY DEVICE

(71) Applicant: WuHan TianMa Micro-electronics CO., LTD., Wuhan (CN)

(72) Inventors: Shuangli Zhu, Wuhan (CN); Kangguan Pan, Wuhan (CN); Leilei Cao, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 93 days.

(21) Appl. No.: 17/218,665

(22) Filed: Mar. 31, 2021

(65) Prior Publication Data
US 2021/0217822 A1 Jul. 15, 2021

(30) Foreign Application Priority Data
Dec. 21, 2020 (CN) .......................... 202011515758.0

(51) Int. Cl.
*H10K 59/124* (2023.01)
*H10K 50/80* (2023.01)
(Continued)

(52) U.S. Cl.
CPC ........... *H10K 59/124* (2023.02); *H10K 50/80* (2023.02); *H10K 59/30* (2023.02);
(Continued)

(58) Field of Classification Search
CPC .............. H01L 27/3258; H01L 27/324; H01L 27/3206; H01L 27/3248; H01L 27/32626;
(Continued)

(56) References Cited

U.S. PATENT DOCUMENTS

2020/0168695 A1* 5/2020 Moon .................. H10K 77/111
2020/0365672 A1* 11/2020 Choi .................. H10K 59/1213
(Continued)

FOREIGN PATENT DOCUMENTS

CN     108054291 A     5/2018

OTHER PUBLICATIONS

State Intellectual Property Office of the People's Republic of China, Text of First Office Action dated Apr. 25, 2022, issued in Chinese Application No. 202011515758.0, filed Dec. 21, 2020, 10 pages.
(Continued)

*Primary Examiner* — Shaun M Campbell
*Assistant Examiner* — Aneta B Cieslewicz
(74) *Attorney, Agent, or Firm* — CHRISTENSEN O'CONNOR JOHNSON KINDNESS PLLC

(57) ABSTRACT

A display panel and a display device are provided. The display panel includes a substrate, a driving circuit layer, a planarization layer, and a light-emitting unit layer. The driving circuit layer is provided on a side of the substrate. The planarization layer is provided on a side of the driving circuit layer facing away from the substrate. The light-emitting unit layer is provided on a side of the planarization layer facing away from the driving circuit layer. The planarization layer includes a first planarization sublayer and a second planarization sublayer. The first planarization sublayer is arranged at least in a first region of the display panel. The second planarization sublayer is arranged at least
(Continued)

in a second region of the display panel. Materials of the first planarization sublayer and the second planarization sublayer are different in composition.

19 Claims, 11 Drawing Sheets

(51) Int. Cl.
*H10K 59/30* (2023.01)
*H10K 59/121* (2023.01)
*H10K 77/10* (2023.01)
*H10K 59/122* (2023.01)
*H10K 59/123* (2023.01)
*H10K 102/00* (2023.01)

(52) U.S. Cl.
CPC ....... *G09G 2380/02* (2013.01); *H10K 59/122* (2023.02); *H10K 59/123* (2023.02); *H10K 59/1213* (2023.02); *H10K 77/111* (2023.02); *H10K 2102/311* (2023.02)

(58) Field of Classification Search
CPC .................. H01L 51/0097; H01L 51/52; H01L 2251/5338; H01L 27/3244; H01L 27/3246; H01L 27/3262; H01L 27/3279; G09G 2380/02; H10K 59/30; H10K 59/122; H10K 59/123; H10K 59/124; H10K 59/1213; H10K 77/111; H10K 2102/311; H10K 50/80; H10K 59/12; H10K 59/80; H10K 59/1315; H10K 50/88; H10K 77/00

See application file for complete search history.

(56) References Cited

U.S. PATENT DOCUMENTS

| | | | |
|---|---|---|---|
| 2021/0066423 A1* | 3/2021 | Lee | ..................... H01L 51/5253 |
| 2022/0045151 A1* | 2/2022 | Jeong | ................. H10K 59/1213 |
| 2022/0059633 A1* | 2/2022 | Kang | ................... H01L 27/3248 |
| 2022/0077246 A1* | 3/2022 | You | ......................... H01L 51/56 |

OTHER PUBLICATIONS

Cho, D. et al., "Surface Control of Planarization Layer on Embossed Glass for Light Extraction in OLEDs," ETRI Journal, vol. 36, No. 5, Oct. 2014, pp. 847-855.

JSR's OLED Materials; OPTMER JEM Series; JSR Corporation Display Solution Dev., URL <Http://www.jsr.co.jp>.

Shi, G. et al., "Side-Chain Polymides as Binder Polymers for Photolithographic Patterning of a Black Pixel Define Layer for Organic Light Emitting Diode," Hindawi, International Journal of Polymer Science, vol. 2018, Article ID 3790834, 7 pages.

* cited by examiner

DISPLAY PANEL AND DISPLAY DEVICE

CROSS-REFERENCE TO RELATED APPLICATIONS

The present application claims priority to Chinese Patent Application No. 202011515758.0, filed on Dec. 21, 2020, the content of which is incorporated herein by reference in its entirety.

TECHNICAL FIELD

The present disclosure relates to the field of display technology, and more particularly, to a display panel and a display device.

BACKGROUND

With incremental development of display technology, various display products with different functions have emerged in order to meet different usage requirements. Researchers have focused on how to design a structure of a display panel, to ensure that various functions to be performed by the display panel can be exerted to a greater extent while increasing functions of the display panel.

SUMMARY

In view of this, embodiments of the present disclosure provide a display panel and a display device to achieve multiple functions of the display panel and ensure that various functions may be exerted to a greater extent.

In an aspect, embodiments of the present disclosure provide a display panel that includes a substrate, a driving circuit layer disposed on a side of the substrate, a planarization layer disposed on a side of the driving circuit layer facing away from the substrate, and a light-emitting unit layer provided on a side of the planarization layer facing away from the driving circuit layer. In an embodiment, the planarization layer includes a first planarization sublayer and a second planarization sublayer, the first planarization sublayer is arranged at least in a first region of the display panel, and the second planarization sublayer is arranged at least in a second region of the display panel. In an embodiment, a material of the first planarization sublayer and a material of the second planarization sublayer are different in composition.

In another aspect, embodiments of the present disclosure provide a display device including the display panel as described above.

BRIEF DESCRIPTION OF DRAWINGS

In order to clearly illustrate technical solutions of embodiments of the present disclosure, drawings used in embodiments are briefly described below. It is apparent that the drawings in the following description are only some embodiments of the present disclosure, and for those skilled in the art, other drawings can be obtained based on these drawings without involving inventive steps.

DESCRIPTION OF EMBODIMENTS

In order to understand technical solutions of the present disclosure, embodiments of the present disclosure will be described in detail below with reference to the accompanying drawings.

It should be noted that the described embodiments are only some of embodiments of the present disclosure, rather than all of the embodiments. In view of embodiments of the present disclosure, all other embodiments obtained by those skilled in the art without involving inventive steps shall fall within the scope of the present disclosure.

Terms used in embodiments of the present disclosure are only for a purpose of describing specific embodiments, and are not intended to limit the present disclosure. Singular forms of "a", "said" and "the" used in embodiments of the present disclosure and the attached claims are also intended to include plural forms, unless otherwise the context clearly indicates other meanings.

It should be understood that the term "and/or" used herein is only an associated relationship describing associated objects and represents that there may be three types of relationships, for example, A and/or B may represent that only A exists, both A and B exist, or only B exists. In addition, the character "/" herein generally indicates that associated objects before and after the character "/" are in an "or" relationship.

It should be understood that although terms first, second, third, etc. may be used to describe planarization layers according to embodiments of the present disclosure, the planarization layers should not be limited to these terms. These terms are only used to distinguish planarization layers at different positions from each other. For example, without departing from the scope of embodiments of the present disclosure, a first planarization sublayer may also be referred to as a second planarization sublayer, and similarly, the second planarization sublayer may also be referred to as the first planarization sublayer.

Figure 1:
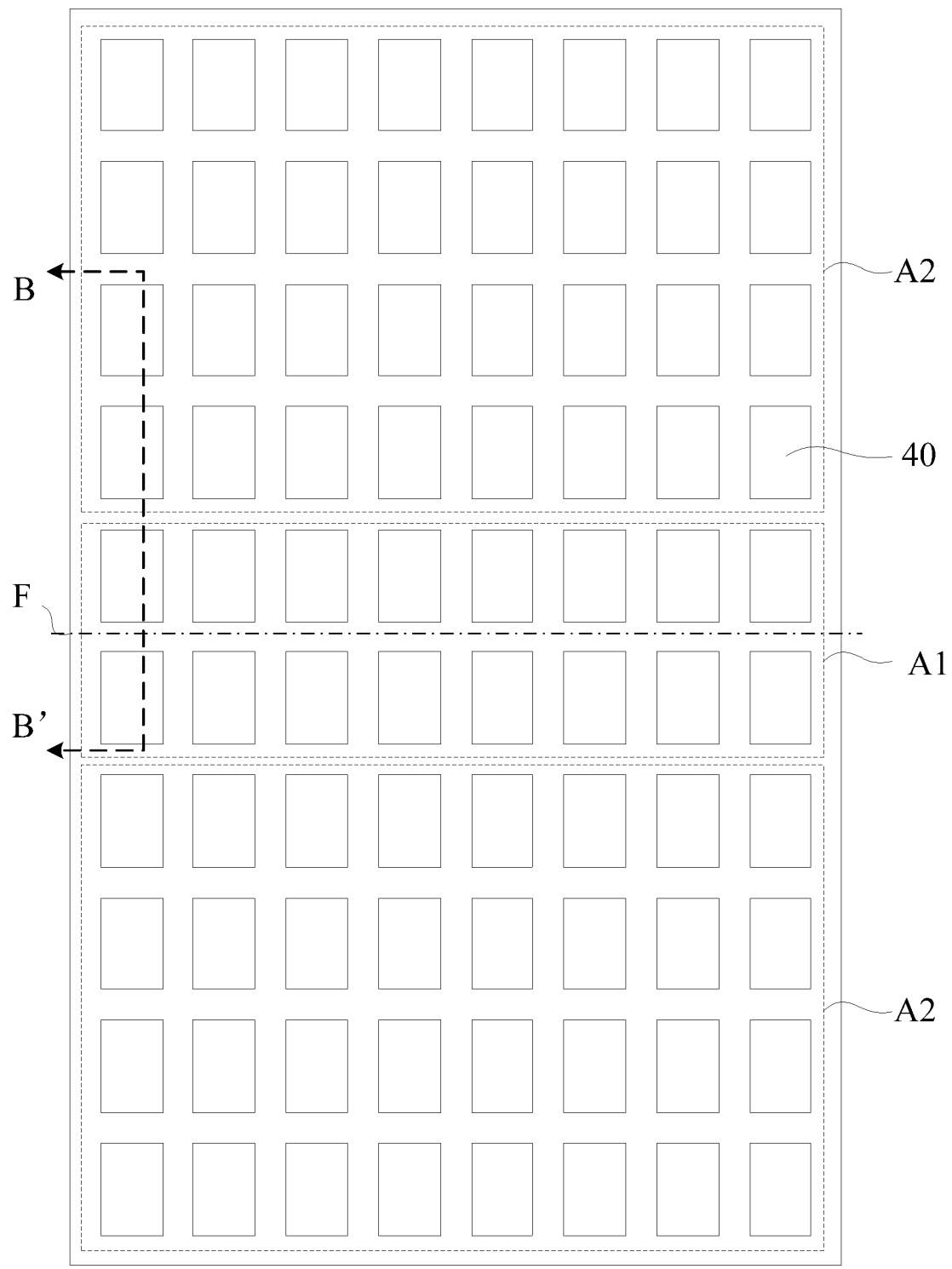
FIG. 1 is a schematic top view of a display panel according to an embodiment of the present disclosure.
Figure 2:
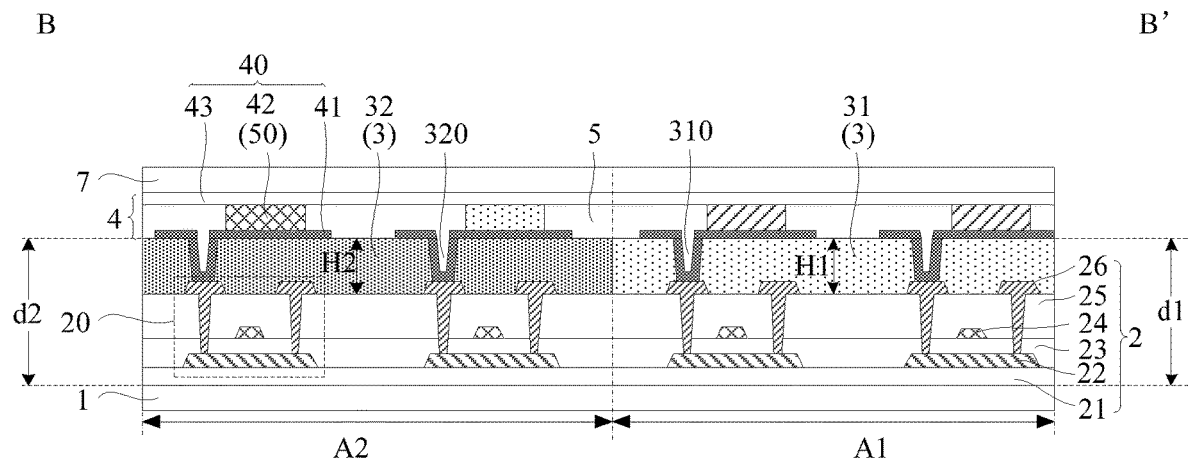
FIG. 2 is a schematic sectional view taken along line BB' in FIG. 1, according to an embodiment of the present disclosure.

Embodiments of the present disclosure provide a display panel. As illustrated in FIGS. 1 and 2, FIG. 1 is a schematic top view of a display panel according to an embodiment of the present disclosure, and FIG. 2 is a schematic sectional view taken along line BB' in FIG. 1. A display panel 100 includes a substrate 1, a driving circuit layer 2, a planarization layer 3, and a light-emitting unit layer 4. The driving circuit layer 2 is disposed on a side of the substrate 1. The planarization layer 3 is disposed on a side of the driving circuit layer 2 facing away from the substrate 1. The light-emitting unit layer 4 is disposed on a side of the planarization layer 3 facing away from the driving circuit layer 2.

According to embodiments of the present disclosure, the light-emitting unit layer 4 may include a plurality of light-emitting units 40 emitting light of different colors. For example, the light-emitting units 40 may include a red light-emitting unit emitting red light, a green light-emitting unit emitting green light, and a blue light-emitting unit emitting blue light. As an example, an organic light emitting diode (OLED) may be selected to prepare each of the light-emitting units 40 described above according to embodiments of the present disclosure. Alternatively, according to embodiments of the present disclosure, the light-emitting unit 40 may also be configured as a micro light emitting diode (Micro-LED) or a quantum light emitting diode (QLED). When an OLED is selected for the light-emitting unit 40, as illustrated in FIG. 2, the light-emitting unit 40 includes a first electrode 41 and a second electrode 43 that are opposite to each other, and an organic light-emitting layer 42 that emits light of a corresponding color and is located between the first electrode 41 and the second electrode 43. In an embodiment, the first electrode 41 may be an anode of the light-emitting unit 40, and the second electrode 43 may be a cathode of the light-emitting unit 40. According to embodiments of the present disclosure, the first electrodes 41 of different light-emitting units 40 are not connected to each other, and the second electrodes 43 of different light-emitting units 40 are connected to each other, such that the second electrodes 43 are formed into a planar structure covering a plurality of organic light-emitting layers 42, and the second electrodes 43 of the plurality of light-emitting units 40 are formed through one process, thereby simplifying the manufacturing process of the display panel.

The driving circuit layer 2 is provided with a plurality of driving circuits for driving the light-emitting units 40 to emit light. The driving circuits may include a plurality of thin film transistors (TFT) 20 and an electronic device such as a storage capacitor. FIG. 2 only schematically indicates one TFT 20 connected to the light-emitting unit 40.

Specifically, as illustrated in FIG. 2, along a thickness direction of the substrate 1, the driving circuit layer 2 includes a first insulation layer 21, a semiconductor layer 22, a second insulation layer 23, a first metal layer 24, a third insulation layer 25, and a second metal layer 26 laminated to each other. The first insulation layer 21 located between the TFTs 20 and the substrate 1 is used as a buffer layer to protect the TFTs 20 from intrusion of impurity ions in the substrate 1. A plurality of individual electrodes are formed in the first metal layer 24 and the second metal layer 26. An electrode located in the first metal layer 24 may be used to form a gate electrode of the TFT 20. Electrodes located in the second metal layer 26 may respectively form a source electrode and a drain electrode of the TFT 20. The first electrode 41 of the light-emitting unit 40 is electrically connected to a source electrode or drain electrode of a corresponding TFT 20. The semiconductor layer 22 may include a semiconductor material such as monocrystalline silicon, polycrystalline silicon, or oxide.

As illustrated in FIG. 2, according to an embodiment of the present disclosure, the planarization layer 3 includes a first planarization sublayer 31 and a second planarization sublayer 32. The first planarization sublayer 31 is located at least in a first region A1 of the display panel, and the second planarization sublayer 32 is located at least in a second region A2 of the display panel. Materials of the first planarization sublayer 31 and the second planarization sublayer 32 are different in composition. The first planarization sublayer 31 and the second planarization sublayer 32 are in contact with the driving circuit layer 2. As illustrated in FIG. 2, the first planarization sublayer 31 and the second planarization sublayer 32 are both in contact with the second metal layer 26 where the source electrode and the drain electrode of the TFT 20 are located. The first planarization sublayer 31 and the second planarization sublayer 32 are provided to fill up segment difference at a surface of the driving circuit layer 2 and facilitate formation of a film layer located above the first planarization sublayer 31 and the second planarization sublayer 32.

When the first region A1 and the second region A2 of the display panel are regions used for performing different functions in the display panel, according to embodiments of the present disclosure, the first planarization sublayer 31 and the second planarization sublayer 32 are provided in the first region A1 and the second region A2 of the display panel, respectively, and materials of the first planarization sublayer 31 and the second planarization sublayer 32 are different in composition. In this way, performance of the first planarization sublayer 31 and the second planarization sublayer 32 can accommodate functions of respective regions where the first planarization sublayer 31 and the second planarization sublayer 32 are located, and functions of the first region A1 and the second region A2 can be exerted to a great extent. That is, through using an arrangement according to embodiments of the present disclosure, the first planarization sublayer 31 and the second planarization sublayer 32 in different regions of the display panel perform different functions, so that the first planarization sublayer 31 and the second planarization sublayer 32 can respectively accommodate the functions to be achieved by the respective regions where the first planarization sublayer 31 and the second planarization sublayer 32 are located. Hence, different functions of the display panel can be exerted to a great extent.

According to an exemplary embodiment, the above first region A1 may be a region of the display panel that has a relatively high requirement for mechanical strength. The mechanical strength represents a maximum force that can be withstood by the display panel when a force is applied to the display panel, to ensure that no crack will be caused inside the display panel. The mechanical strength may include a bending strength and an impact strength. The bending strength represents a maximum bending force that can be withstood by the display panel when the display panel is folded, to ensure that no crack will be caused inside the display panel. The impact strength represents a maximum impact force that can be withstood by the display panel, to ensure that no crack will be caused inside the display panel under an action of external impact.

For example, the display panel according to embodiments of the present disclosure may be a bendable display panel. In this case, the first region A1 is a bendable region of the display panel, and the second region A2 is a non-bendable region of the display panel. As illustrated in FIG. 1, the first region A1 includes a bending axis F. The display panel is bendable or even foldable about the bending axis F, so that the display panel has various appearances.

When the display panel is configured to be the bendable display panel, the display panel may include at least two second regions A2, and at least one first region A1. In this case, two second regions of the at least two second regions A2 are arranged on two sides of one of the at least one first region A1. FIG. 1 is a schematic diagram of configuring the display panel to include two second regions A2 and one first region A1.

When the first region A1 is in an unfolded state, a plurality of second regions A2 may be on the same plane as shown in FIG. 1. When the display panel performs display, the plurality of second regions A2 may all be used for display, so that the display panel can achieve a large-screen display function.

Figure 3:
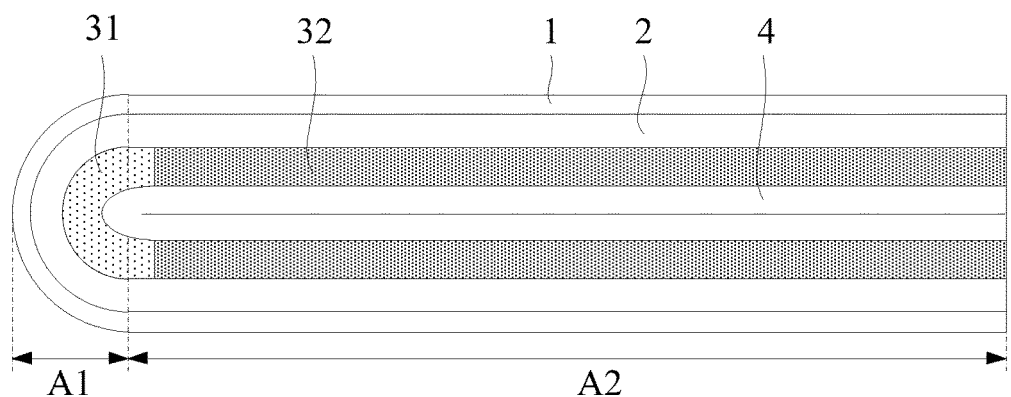
FIG. 3 is a schematic sectional view of a display panel in a folded state according to an embodiment of the present disclosure.
Figure 4:
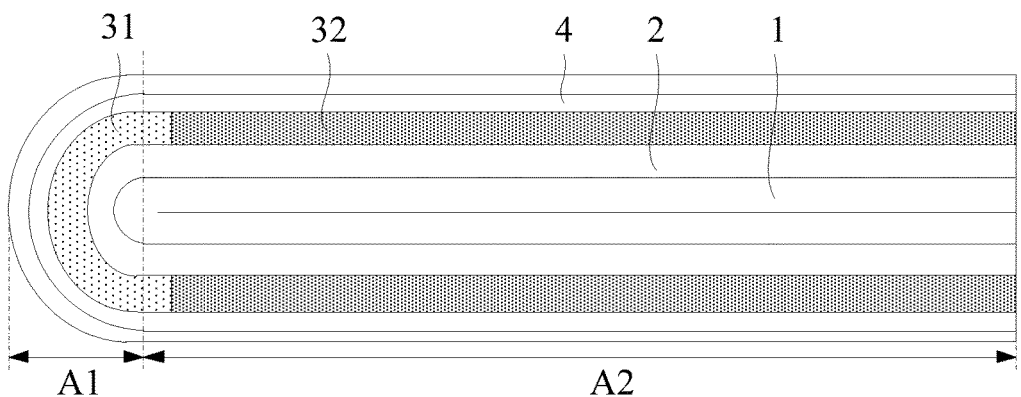
FIG. 4 is a schematic sectional view of another display panel in a folded state according to an embodiment of the present disclosure.

Referring to FIGS. 3 and 4, the first region A1 is in a folded state. FIGS. 3 and 4 are two schematic sectional views that respectively illustrate the display panel in the folded state according to embodiments of the present disclosure, and FIG. 3 is a schematic diagram of the display panel after being bent inward. The light-emitting units 40 in the light-emitting unit layer 4 may not emit light in the folded state, and the display panel is in a non-display state. Such an arrangement may reduce an area occupied by the display panel and improve portability of the display panel. FIG. 4 is a schematic diagram of the display panel after being bent outward. The light-emitting units 40 in the light-emitting unit layer 4 emits light in the folded state. In this case, a display screen may be observed from opposite sides of the display panel along a thickness direction thereof, so that a user has a better experience.

It should be noted that, in order to illustrate stacked relationship of film layers of the display panel more clearly, interior details of the driving circuit layer 2 and the light-emitting unit layer 4 are not illustrated in FIGS. 3 and 4.

Figure 5:
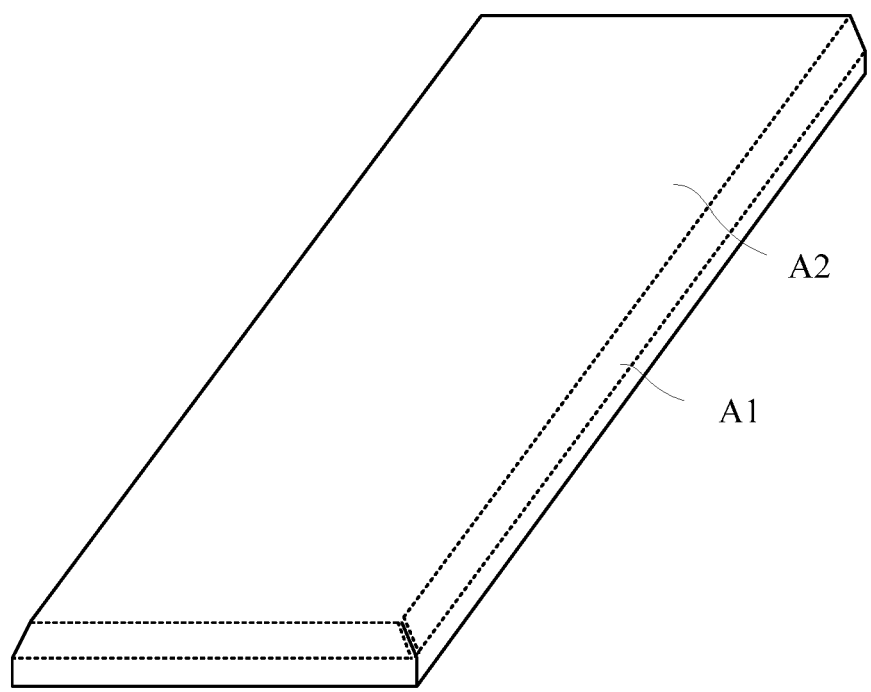
FIG. 5 is a schematic diagram of another display panel in a folded state according to an embodiment of the present disclosure.

Alternatively, as illustrated in FIG. 5, which is a schematic diagram of another display panel in a folded state according to an embodiment of the present disclosure, the display panel may include at least two first regions A1, and at least one second region A2, and two first regions A1 of the at least two first regions are arranged on two sides of the second region A2. When the first regions A1 are bent, a bending angle of the first regions A1 is controlled, as illustrated in FIG. 5, such that a region where the second region A2 is located is a front display region of the display panel, and regions where the first regions A1 are located are side display regions of the display panel. In this way, when viewed from a normal direction of the front display region, a display screen of the second region A2 and a display screen of the first region A1 may be observed simultaneously. Accordingly, an area of the front display region is increased and a screen-to-body ratio of the display panel.

When the display panel according to embodiments of the present disclosure is a bendable display panel, the substrate 1 as described above may be made of a flexible material. For example, the substrate 1 may be made of any one or more of, such as polyethersulfone (PES), polyetherimide (PEI), polyethylene naphthalate (PEN), polyethylene terephthalate (PET), polyphenylene sulfide (PPS), polyarylate (PAR), polyimide (PI), and polycarbonate (PC).

When the first region A1 is a bendable region of the display panel, the first planarization sublayer 31 located in the first regions A1 have a relatively small elasticity modulus in embodiments of the present disclosure. When a bending operation is performed on the first regions A1, the first planarization sublayer 31 may easily deform under an action of a bending stress to release the bending stress, thereby avoiding occurrence of a stress concentration position in the first planarization sublayer 31, and facilitating to reduce possibility of crack occurrences in the first planarization sublayer 31 during a bending process. Furthermore, in a process of restoring the first regions A1 from a folded state to an unfolded state, deformation of the first planarization sublayer 31 generated during the bending process is restored in time, which may prevent unevenness of the first planarization sublayer 31 caused by a partial thickness reduction or an accumulation of film layers since the deformation fails to be restored in time. Accordingly, such an arrangement may increase a fracture strength of the first region A1 where the first planarization sublayer 31 is located, and enable the first planarization sublayer 31 to withstand more bending operations, thereby improving reliability of the display panel.

In some embodiments of the present disclosure, the elasticity modulus of the first planarization sublayer 31 is E1, where E1≤3.5 GPa, so as to ensure bending performance of the first regions A1 where the first planarization sublayer 31 is located.

When the second region A2 is an unfolded region of the display panel, and the light-emitting units 40 are provided in the second region A2 so that the second region A2 is a display region, in some embodiments of the present disclosure, an elasticity modulus of the second planarization sublayer 32 in the second region A2 may be relatively large, so that the elasticity modulus of the second planarization sublayer 32 is greater than that of the first planarization sublayer 31 to reduce possibility of deformation of the second planarization sublayer 32. In this way, flatness of the second planarization sublayer 32 is guaranteed, and performance of the light-emitting unit layer 4 formed above the second planarization sublayer 32 is guaranteed, thereby ensuring that the second region A2 has an excellent display effect.

When the light-emitting unit 40 is the OLED as illustrated in FIG. 2, a microcavity effect is commonly used to improve light-emitting efficiency and chromaticity of the OLED. A microcavity length of the OLED needs to be designed according to a color of emitted light, in order to enable light of a specific color emitted from the OLED to obtain a maximum resonance enhancement in a microcavity structure. The microcavity length is a distance between two electrodes of the OLED. If the OLED is formed at an uneven position, the microcavity length of the OLED may be changed as compared with forming the OLED at an even position, thereby causing the color of the light emitted from the OLED to be different from a desired color and thus inducing color offset.

In some embodiments of the present disclosure, a material with a relatively large elasticity modulus is used to form the second planarization sublayer 32 so as to compensate the segment difference at the surface of the driving circuit layer 2, reduce the possibility of deformation of the second planarization sublayer 32, and ensure surface flatness of the second planarization sublayer 32. Accordingly, the light-emitting units 40 formed on the second planarization sublayer 32 has a microcavity length meeting design requirements, and color offset may be avoided.

In an embodiment, an elasticity modulus E2 of the second planarization sublayer 32 satisfies E1<E2≤4.5 Gpa. Such an arrangement may ensure the surface flatness of the second planarization sublayer 32 while avoiding increasing brittleness of the second planarization sublayer 32. Further, the second region A2 has a relatively high impact strength while eliminating color offset, thereby reducing difference between the mechanical strength of the first region A1 and the mechanical strength of the second region A2 of the display panel. That is, when the first region A1 is bent, the first planarization sublayer 31 may ensure that the first region A1 has good bending performance, so that the first planarization sublayer 31 is able to withstand multiple bendings without cracking. The second planarization sublayer 32 is provided to eliminate color offset of the second region A2. Further, when an external impact force acts on the second region A2, the second planarization sublayer 32 may also resist a relatively large impact force without crack or fracture, so that the second region A2 has a strong ability to resist against the external impact force.

When the display panel is a bendable display panel, the second region A2 may be provided in a region of the display panel that is more sensitive to human eyes according to some embodiments of the present disclosure. Such arrangement of the second planarization sublayer 32 may ensure that the second region A2 has a good display effect, meet display requirements, and avoid color offset observed by human eyes. In addition, since it is unnecessary to perform a bending operation on the second region A2, the second planarization sublayer 32 according to some embodiments of the present disclosure may meet requirements for mechanical strength of this region during daily use.

According to some embodiments of the present disclosure, the bendable display panel is manufactured in a manner that bending reliability of the bendable display panel may be guaranteed and service lifetime of the bendable display panel may be prolonged relative to a conventional display. Also, in an embodiment, a display effect of the bendable display panel is configured to avoid or to reduce the occurrence of color offset during display.

In some embodiments of the present disclosure, as illustrated in FIG. 2, the second planarization sublayer 32 includes a via hole 320. In the second region A2, the light-emitting unit 40 is electrically connected to the TFT 20 in the driving circuit layer 2 through the via hole 320.

As illustrated in FIG. 2, the display panel further includes a pixel definition layer 5 and an encapsulation layer 7. The pixel definition layer 5 is disposed on a side of the second planarization sublayer 32 facing away from the driving circuit layer 2. The pixel definition layer 5 includes a plurality of openings 50, and the organic light-emitting layer 42 is disposed in a region defined by the openings 50. The encapsulation layer 7 is located on a side of the light-emitting unit layer 4 facing away from the substrate 1. The encapsulation layer 7 may adopt a thin-film encapsulation structure formed by laminating an inorganic layer and an organic layer.

For example, when the display panel is the bendable display panel, as illustrated in FIGS. 1 and 2, according to some embodiments of the present disclosure, at least part of the light-emitting units 40 in the light-emitting unit layer 4 is located in the first region A1, except for arranging the light-emitting units 40 in the second region A2. That is, the first region A1 that is used as the bending region may also have a display function. Correspondingly, in order to drive the light-emitting units 40 in the first region A1 to emit light, as illustrated in FIG. 2, according to some embodiments of the present disclosure, at least part of the plurality of driving circuits in the driving circuit layer 2 may be arranged in the first region A1 and a via hole 310 is formed in the first planarization sublayer 31, such that the light-emitting unit 40 in the first region A1 is electrically connected to the TFT 20 in a corresponding driving circuit through the via hole 310. When the display panel is in the unfolded state, the first region A1 and the second region A2 may be both used for display, so as to increase a display area of the display panel.

As illustrated in FIG. 2, when the first region A1 and the second region A2 both include the light-emitting unit 40, any one of an orthographic projection of the first electrode 41 of the light-emitting unit 40 in the first region A1 on a plane of the substrate 1 and an orthographic projection of the first electrode 41 of the light-emitting unit 40 in the second region A2 on the plane of the substrate 1 does not overlap with an interface of the first planarization sublayer 31 and the second planarization sublayer 32. Further, any one of an orthographic projection of the organic light-emitting layer 42 of the light-emitting unit 40 in the first region A1 on the plane of the substrate 1 and an orthographic projection of the organic light-emitting layer 42 of the light-emitting unit 40 in the second region A2 on the plane of the substrate 1 does not overlap with the interface of the first planarization sublayer 31 and the second planarization sublayer 32. When an uneven structure such as a protrusion or a depression appears at the interface of the first planarization sublayer 31 and the second planarization sublayer 32 due to process error, the above arrangement may prevent the uneven structure from affecting manufacture of the first electrode 41 and the organic light-emitting layer 42, thereby ensuring that an actual microcavity length of the light-emitting unit 40 is not affected and thus avoiding occurrence of color offset.

Figure 6:
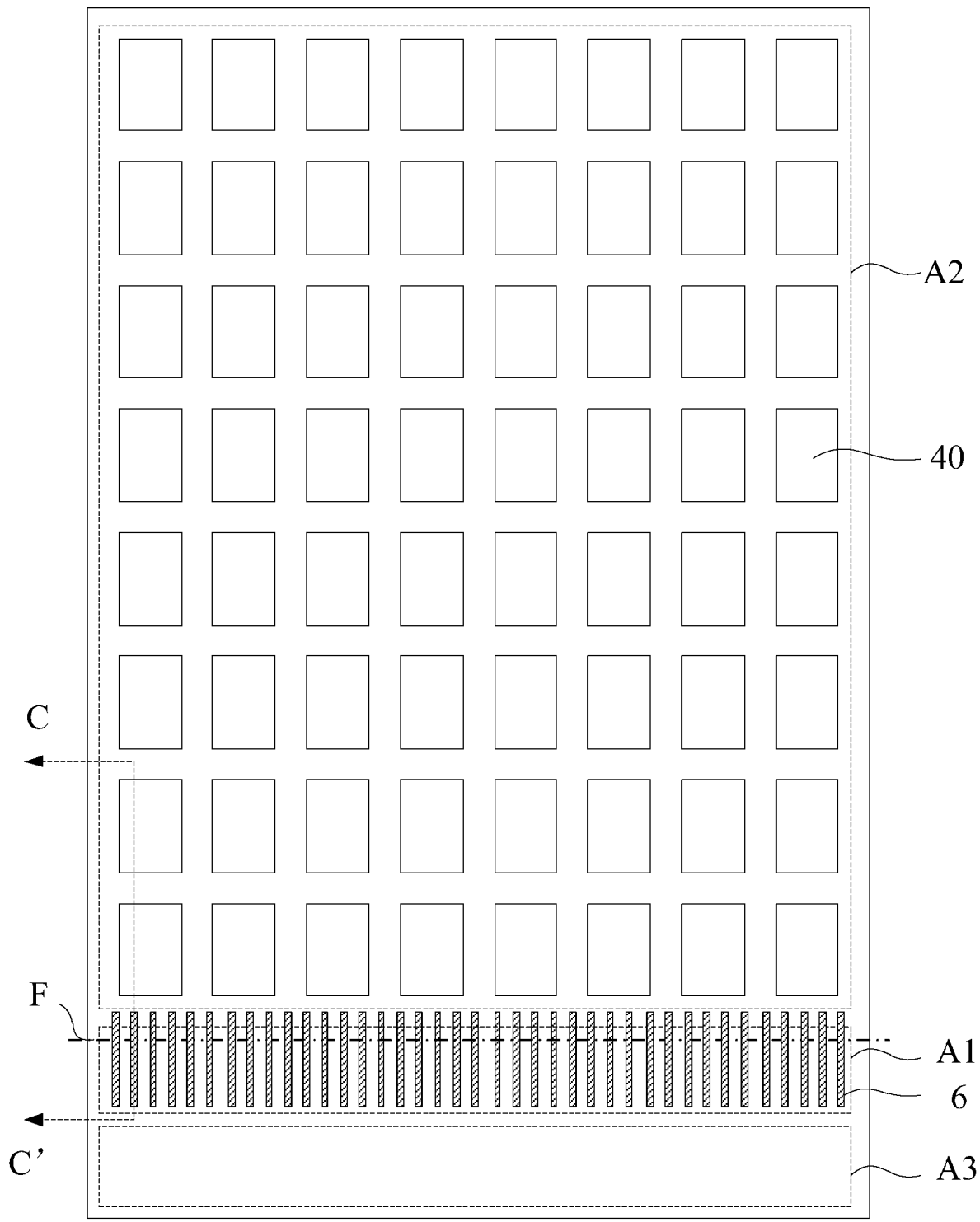
FIG. 6 is a schematic top view of another display panel according to an embodiment of the present disclosure.
Figure 7:
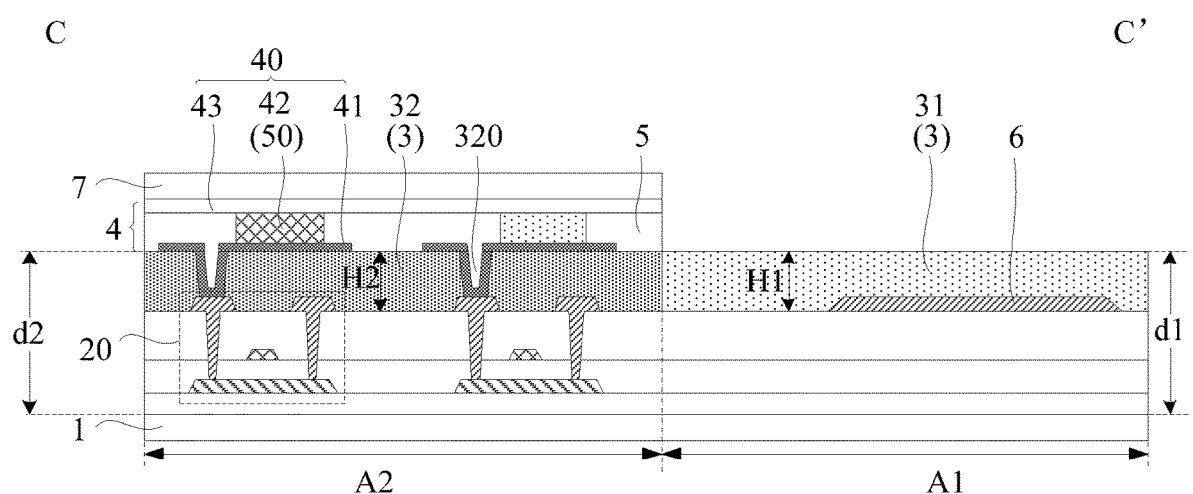
FIG. 7 is a schematic sectional view taken along line CC' in FIG. 6, according to an embodiment of the present disclosure.

As illustrated in FIGS. 6 and 7, FIG. 6 is a schematic top view of another display panel according to an embodiment of the present disclosure, and FIG. 7 is a schematic sectional view taken along line CC' in FIG. 6. The display panel further includes a third region A3 for binding a driver chip. The third region A3 is located on a side of the first region A1 facing away from the second region A2. The first region A1 includes connecting pads 6 and the first planarization sublayer 31 as described above. The connecting pads 6 are configured to connect signal lines in the second region A2 and the driver chip in the third region A3. In this case, the first region A1 may be not provided with the above light-emitting unit layer 4. That is, the first region A1 is a non-display region of the display panel. In this case, the first region A1 may still include the bending axis F. The first region A1 may be bent about the bending axis F, so that the third region A3 is moved to a back surface of the display panel, thereby reducing a frame width of the display panel and increasing the screen-to-body ratio of the display panel.

The back surface of the display panel is a surface of the display panel that is not provided with the light-emitting unit 40 thereon.

For example, the pixel definition layer 5 and the encapsulation layer 7 are not provided in the first region A1 as illustrated in FIG. 7. The connecting pads 6 may be arranged in the same layer as the source electrode and the drain electrode of the TFT 20. The first planarization sublayer 31 covers the connecting pads 6. The first planarization sublayer 31 is provided, so as to improve the bending performance of the first region A1 and isolate the connecting pads 6 from external environment, thereby protecting the connecting pad 6.

For example, the above first planarization sublayer 31 and the second planarization sublayer 32 may be formed by coating. In this case, according to some embodiments of the present disclosure, a viscosity of a material for forming the second planarization sublayer 32 may be lower than a viscosity of a material for forming the first planarization sublayer 31, so that the second planarization sublayer 32 has a good leveling property, thereby further improving flatness of a surface of the second planarization sublayer 32.

In an embodiment, as illustrated in FIG. 2, a thickness H1 of the first planarization sublayer 31 may be set to be equal to a thickness H2 of the second planarization sublayer 32 in the normal direction of the display panel according to some embodiments of the present disclosure. When a first portion of the driving circuit layer 2 in the first region A1 and a second portion of driving circuit layer 2 in the second region A2 are formed of a same film layer, the first and second portions of the driving circuit layer 2 in the first region A1 and the second region A2 have a same thickness. According to some embodiments of the present disclosure, the first planarization sublayer 31 and the second planarization sublayer 32 are configured to have the same thickness, so that a distance d1 from a surface of the first planarization sublayer 31 facing away from the substrate 1 to the substrate 1 may be equal to a distance d2 from a surface of the second planarization sublayer 32 facing away from the substrate 1 to the substrate 1. Accordingly, the surface of the second planarization sublayer 32 facing away from the substrate 1 is flush with the surface of the first planarization sublayer 31 facing away from the substrate 1. That is, an entire surface formed by the first planarization sublayer 31 and the second planarization sublayer 32 is flat. Referring to FIG. 2, when the light-emitting units 40 are formed in the first region A1 and the second region A2, the arrangement according to embodiments of the present disclosure may ensure that neither the first region A1 nor the second region A2 appears color offset during display so as to improve a display effect of the first region A1 and the second region A2. Further, a same process may be adopted to respectively form the light-emitting units 40 emitting light of the same color in the first region A1 and the second region A2 so as to simplify the manufacturing process of the display panel.

Figure 8:
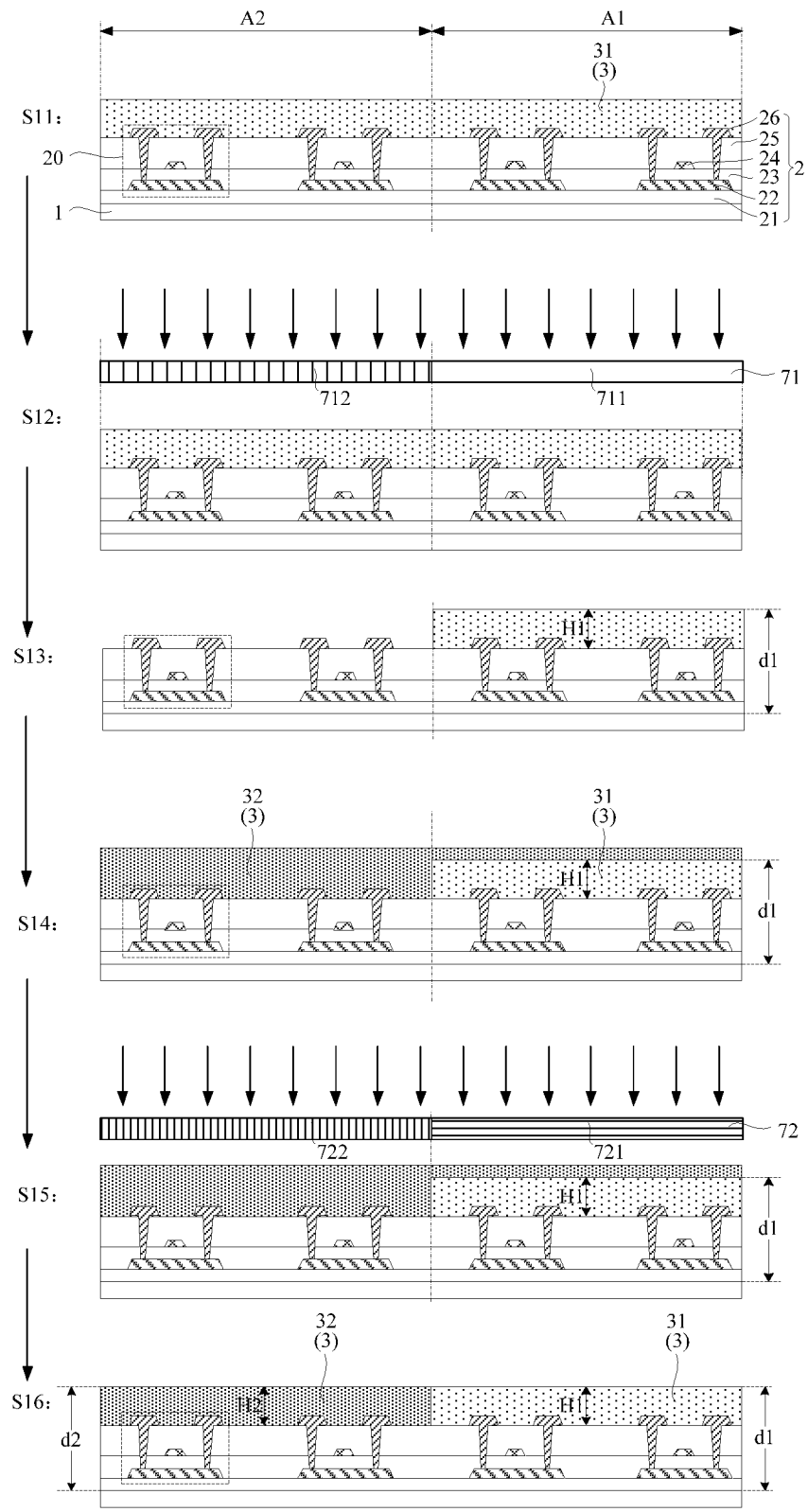
FIG. 8 is a schematic flowchart of a method for manufacturing a display panel according to an embodiment of the present disclosure.

In an embodiment, the material of the first planarization sublayer 31 may include polyimide, and the material of the second planarization sublayer 32 may include silicone resin. When the display panel is formed to have a structure shown in FIG. 2 and FIG. 7, polyimide and silicone resin may be formed into the first planarization sublayer 31 and the second planarization sublayer 32 in different steps according to embodiments of the present disclosure. When the display panel is formed to have the structure shown in FIG. 2, for example, the light-emitting units 40 are arranged in the first region A1 to provide the first region A1 with bending and display functions. Referring to FIG. 8, a schematic flowchart of a method for manufacturing a display panel according to embodiments of the present disclosure is shown. In the illustrate embodiment, the method for manufacturing the display panel includes following steps.

In step S11, the first planarization sublayer 31 covering the first region A1 and the second region A2 is formed by a film-forming process. For example, the film-forming process may be performed by coating.

In step S12, the first planarization sublayer 31 is exposed with a first mask 71. The first mask 71 includes a first light-transmission region 711 and a second light-transmission region 712. A light transmittance of the first light-transmission region 711 is lower than that of the second light-transmission region 712. When the first planarization sublayer is being exposed, the first light-transmission region 711 corresponds to a first portion of the first planarization sublayer 31 located in the first region A1, and the second light-transmission region 712 corresponds to a second portion of the first planarization sublayer 31 located in the second region A2.

In step S13, the second portion of the first planarization sublayer 31 located in the second region A2 is removed by an etching process, and the first portion of the first planarization sublayer 31 with a thickness of H1 is remained in the first region A1. Further, the distance between the surface of the first planarization sublayer 31 facing away from the substrate 1 and the substrate 1 is d1.

In step S14, the second planarization sublayer 32 covering the first region A1 and the second region A2 is formed by the film-forming process. In the first region A1, the second planarization sublayer 32 is in contact with the first planarization sublayer 31, and the second planarization sublayer 32 is located on the side of the first planarization sublayer 31 facing away from the substrate 1. In the second region A2, the second planarization sublayer 32 is in contact with the driving circuit layer 2, and the second planarization sublayer 32 is located on the side of the driving circuit layer 2 facing away from the substrate 1. For example, the film-forming process may also be performed by coating.

In step S15, the second planarization sublayer 32 is exposed with a second mask 72. The second mask 72 includes a first light-transmission region 721 and a second light-transmission region 722. A light transmittance of the first light-transmission region 721 is different from that of the second light-transmission region 722. When the second planarization sublayer 32 is being exposed, the first light-transmission region 721 corresponds to the first portion of the second planarization sublayer 32 in the first region A1, and the second light-transmission region 722 corresponds to the second portion of the second planarization sublayer 32 in the second region A2.

In step S16, the first portion of the second planarization sublayer 32 located in the first region A1 is removed by the etching process. The second portion of the second planarization sublayer 32 located in the second region A2 is partially removed. The first planarization sublayer 31 with a thickness of H1 is remained in the first region A1, and the second planarization sublayer 32 with a thickness of H2 is remained in the second region A2, where H2=H1. In addition, the distance between the surface of the second planarization sublayer 32 facing away from the substrate 1 and the substrate 1 is d2, and d2=d1.

Subsequently, the light-emitting unit layer 4 and other related film layers may be continuously formed above the first planarization sublayer 31 and the second planarization sublayer 32 to form the structure illustrated in FIG. 2.

In some embodiments of the present disclosure, along the thickness direction of the substrate 1, the thickness H1 of the first planarization sublayer 31 and the thickness H2 of the second planarization sublayer 32 are both smaller than or equal to 6 μm, so that the display panel has a relatively small thickness, which is convenient for achieving a thin and light-weight design of the display panel.

Figure 9:
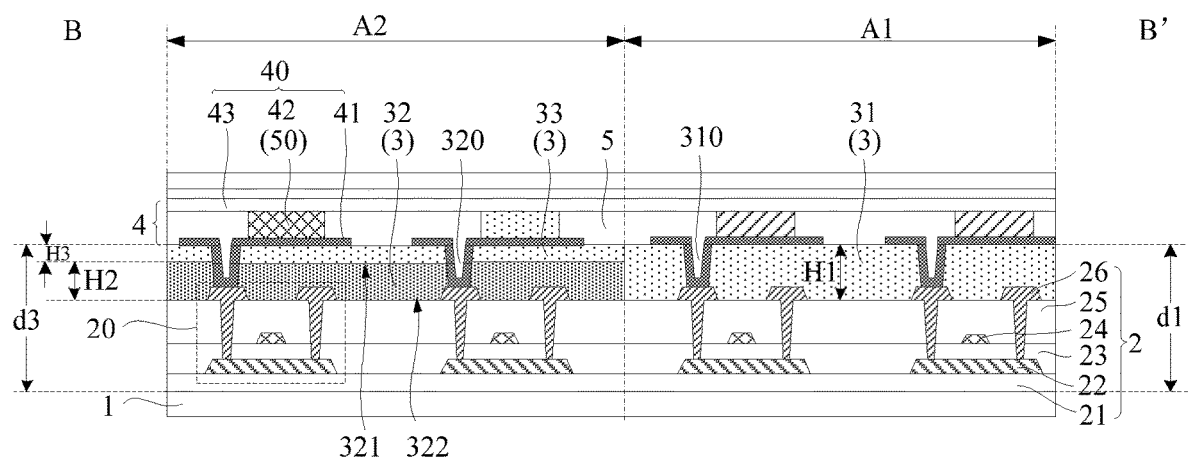
FIG. 9 is a schematic sectional view taken along line BB' in FIG. 1, according to an embodiment of the present disclosure.

Alternatively, as illustrated in FIG. 9, it is another schematic sectional view taken along line BB' in FIG. 1. In some embodiments of the present disclosure, the thickness H2 of the second planarization sublayer 32 may also be smaller than the thickness H1 of the first planarization sublayer 31 in the thickness direction of the substrate. Since the elasticity modulus of the second planarization sublayer 32 is relatively large, the mechanical strength of the second region A2 may be ensured by reducing the thickness of the second planarization sublayer 32. In this case, as illustrated in FIG. 9, a third planarization sublayer 33 stacked with the second planarization sublayer 32 may be provided in the second region A2 according to embodiments of the present disclosure. A material of the third planarization sublayer 33 is different from the material of the second planarization sublayer 32. An elasticity modulus of the third planarization sublayer 33 is smaller than the elasticity modulus of the second planarization sublayer 32. Such an arrangement enables the second region A2 to have good flatness and strong mechanical strength. For example, while ensuring the display effect of the second region A2 and preventing occurrence of color offset in the second region A2, the third planarization sublayer 33 is provided to buffer the impact force when the display panel is impacted by an external force, thereby avoiding occurrence of crack in the second region A2.

In an embodiment, the material of the third planarization sublayer 33 and the material of the first planarization sublayer 31 have the same composition. When manufacturing the display panel with the structure illustrated in FIG. 9, the first planarization sublayer 31 and the third planarization sublayer 33 may be formed in the same process to simplify the manufacturing process of the display panel and to reduce manufacturing cost of the display panel. For example, the material of the third planarization sublayer 33 may include polyimide.

Referring to FIG. 9, the thickness H1 of the first planarization sublayer 31, the thickness H2 of the second planarization sublayer 32, and the thickness H3 of the third planarization sublayer 33 satisfy a condition of H3+H2=H1, so that surfaces of the planarization sublayers in the first region A1 and the second region A2 are flush with each other, thereby facilitating a subsequent process of forming the light-emitting unit layer 4 on the planarization layer.

With continued reference to FIG. 9, the thickness H2 of the second planarization sublayer 32 and the thickness H3 of the third planarization sublayer 33 satisfy a condition of H2>H3. In this way, while ensuring the display effect of the second region A2 and preventing occurrence of color offset in the second region A2, the second region A2 may also have a relatively high breaking strength. In an embodiment, the thickness H3 of the third planarization sublayer 33 may be configured to be smaller than or equal to 3 μm in the thickness direction of the substrate 1 according to embodiments of the present disclosure.

When the second planarization sublayer 32 and the third planarization sublayer 33 are provided, as illustrated in FIG. 9, the second planarization sublayer 32 may be arranged on a side of the third planarization sublayer 33 close to the driving circuit layer 2 according to embodiments of the present disclosure. The second planarization sublayer 32 has a relatively large elasticity modulus as compared with the third planarization sublayer 33, and is thus less likely to be deformed under the external force. The second planarization sublayer 32 is configured to contact the driving circuit layer 2, so that it is easier to compensate segment difference of film layers on the surface of the driving circuit layer 2, thereby achieving a flat surface of the second planarization sublayer 32. When the third planarization sublayer 33 and other film layers are subsequently formed above the second planarization sublayer 32, bottom flatness of these film layers may be more easily achieved.

Referring to FIG. 9, the second planarization sublayer 32 includes a first surface 321 and a second surface 322 that are disposed oppositely in the thickness direction of the substrate 1, and the second surface 322 is located on a side of the first surface 321 adjacent to the driving circuit layer 2. In some embodiments of the present disclosure, as illustrated in FIG. 9, an area of an orthographic projection of the first surface 321 on the plane of the substrate 1 is equal to an area of an orthographic projection of the second surface 322 on the plane of the substrate 1. That is, a sectional shape of the second planarization sublayer 32 is a rectangular-like shape, and a bottom edge of the second planarization sublayer 32 is perpendicular to side edges thereof.

Figure 10:
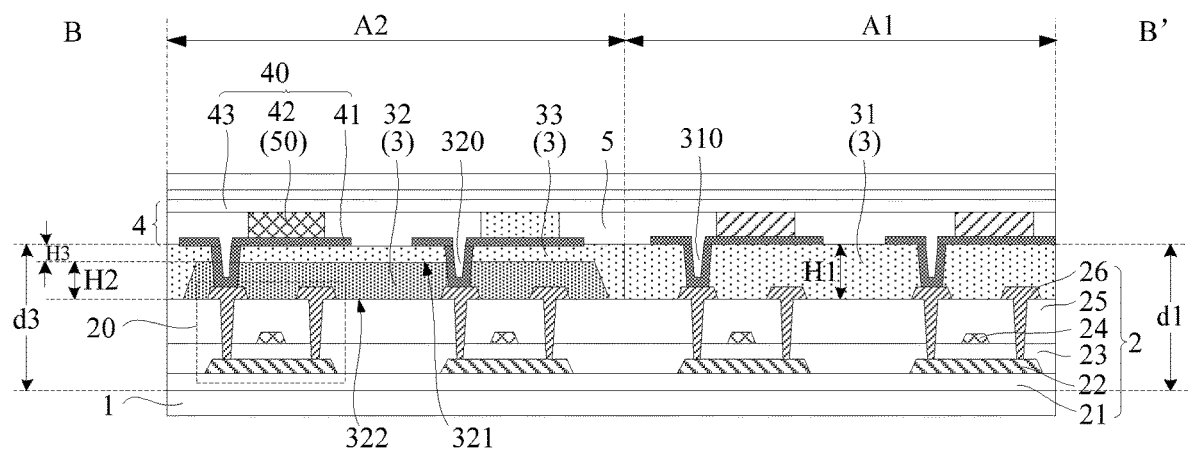
FIG. 10 is another schematic sectional view taken along line BB' in FIG. 1, according to an embodiment of the present disclosure.

Alternatively, as illustrated in FIG. 10, it is another schematic sectional view taken along line BB' in FIG. 1. An area of the orthographic projection of the first surface 321 on the plane of the substrate 1 is smaller than an area of the orthographic projection of the second surface 322 on the plane of the substrate 1. That is, a sectional shape of the second planarization sublayer 32 is a trapezoid, such that an acute angle is formed between a bottom edge and a side edge of the second planarization sublayer 32. An orthographic projection of the third planarization sublayer 33 on the plane of the substrate 1 covers the orthographic projection of the second planarization sublayer 32 on the plane of the substrate 1. With this arrangement, the third planarization sublayer 33 formed above the second planarization sublayer 32 may cover the second planarization sublayer 32, so that the second region A2 may have improved display effect and good mechanical performance while a contact area between the second planarization sublayer 32 and the third planarization sublayer 33 may be increased to reduce possibility of peeling between the second planarization sublayer 32 and the third planarization sublayer 33.

Referring to FIGS. 9 and 10, the distance between the surface of the first planarization sublayer 31 facing away from the substrate 1 and the substrate 1 is d1 at any position in the first region A1, and a distance between a surface of the third planarization sublayer 33 facing away from the substrate 1 and the substrate 1 is d3 at any position in the second region A2, where d1=d3. In this way, an entire surface formed by the first planarization sublayer 31, the second planarization sublayer 32 and the third planarization sublayer 33 in the first region A1 and the second region A2 is flat. While ensuring that the first region A1 and the second region A2 do not have color offset during display and improving the display effect of the first region A1 and the second region A2, the same process may be adopted to form the light-emitting units 40 in the first region A1 and the second region A2 respectively, and the manufacturing process of the display panel may be thus simplified.

Figure 11:
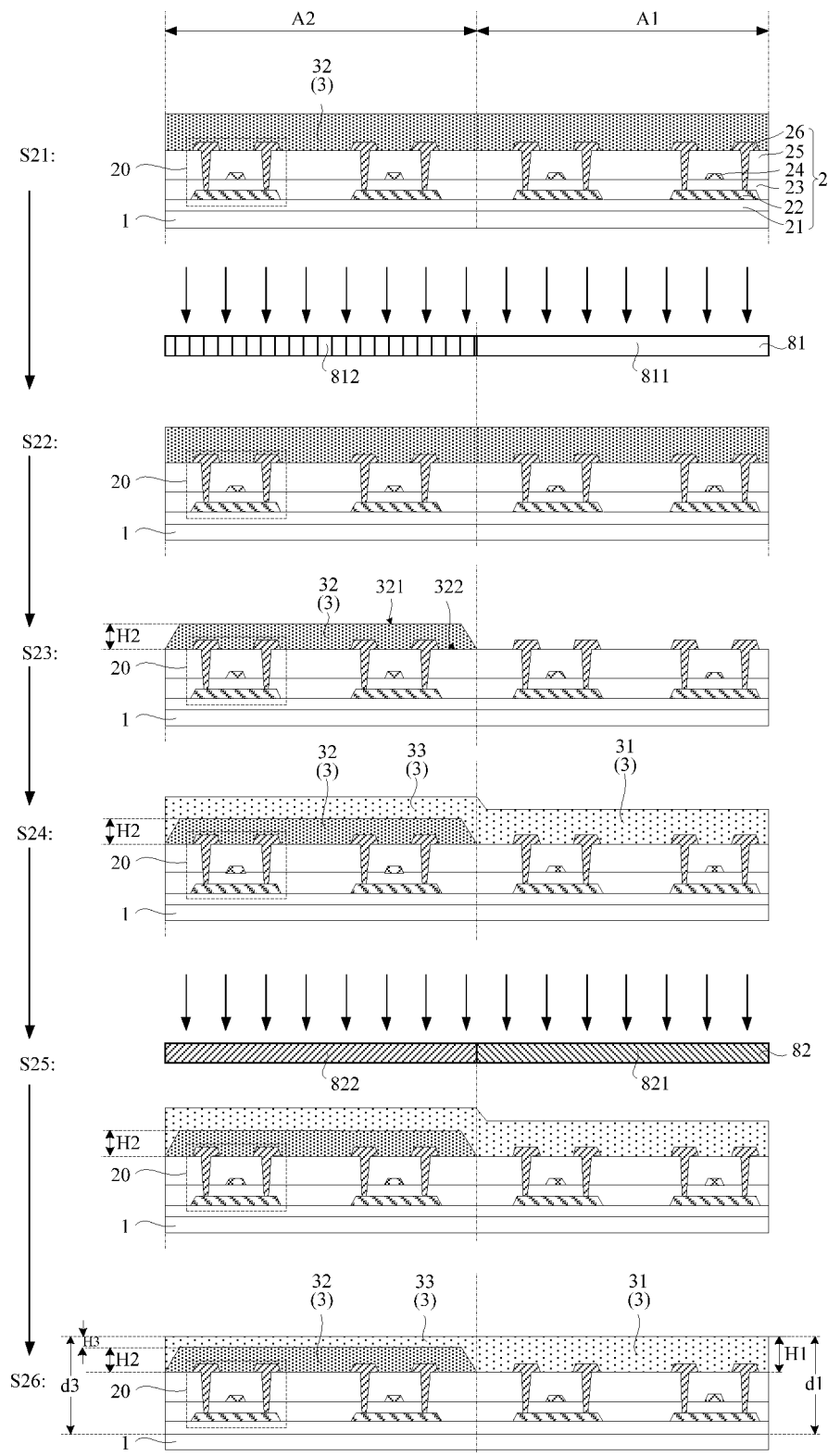
FIG. 11 is a schematic flowchart of another method for manufacturing a display panel according to an embodiment of the present disclosure, according to an embodiment of the present disclosure.

In an embodiment, the display panel having the structure illustrated in FIG. 10 is formed according to a method as illustrated in FIG. 11, which is a schematic flowchart of a method for manufacturing the display panel according to embodiments of the present disclosure. The method for manufacturing the display panel includes following steps.

In step S21, the second planarization sublayer 32 covering the first region A1 and the second region A2 is formed by a film-forming process. For example, the film-forming process may be performed by coating.

In step S22, the second planarization sublayer 32 is exposed with a third mask 81. The third mask 81 includes a first light-transmission region 811 and a second light-transmission region 812. A light transmittance of the first light-transmission region 811 is higher than that of the second light-transmission region 812. When the second planarization sublayer is being exposed, the first light-transmission region 811 corresponds to a first portion of the second planarization sublayer 32 located in the first region A1, and the second light-transmission region 812 corresponds to a second portion of the second planarization sublayer 32 located in the second region A2.

In step S23, the first portion of the second planarization sublayer 32 located in the first region A1 is removed by an etching process, and the second portion of the second planarization sublayer 32 with a thickness of H2 is remained in the second region A2. In this process, an etching speed in the etching process may be controlled such that the area of the orthographic projection of the first surface 321 of the second planarization sublayer 32 on the plane of the substrate 1 is smaller than the area of the orthographic projection of the second surface 322 of the second planarization sublayer 32 on the plane of the substrate 1.

In step S24, the first planarization sublayer 31 covering the first region A1 and the third planarization sublayer 33 covering the second region A2 are formed by the film-forming process. In the first region A1, the first planarization sublayer 31 is in contact with the driving circuit layer 2, and the first planarization sublayer 31 is located on the side of the driving circuit layer 2 facing away from the substrate 1. In the second region A2, the third planarization sublayer 33 is in contact with the second planarization sublayer 32, and the third planarization sublayer 33 is located on the side of the second planarization sublayer 32 facing away from the substrate 1. In this process, the same material may be selected to form the first planarization sublayer 31 and the third planarization sublayer 33, so as to form the first planarization sublayer 31 and the third planarization sublayer 33 simultaneously.

In step S25, the first planarization sublayer 31 and the third planarization sublayer 33 are exposed with a fourth mask 82. The fourth mask 82 includes a first light-transmission region 821 and a second light-transmission region 822. A light transmittance of the first light-transmission region 821 is different from that of the second light-transmission region 822. When the first planarization sublayer 31 and the third planarization sublayer 33 are being exposed, the first light-transmission region 821 corresponds to the first planarization sublayer 31 located in the first region A1, and the second light-transmission region 822 corresponds to the third planarization sublayer 33 located in the second region A2.

In step S26, a part of the first planarization sublayer 31 located in the first region A1 and a part of the third planarization sublayer 33 located in the second region A2 are removed by the etching process. The first planarization sublayer 31 with the thickness of H1 is remained in the first region A1, and the third planarization sublayer 33 with the thickness of H3 is remained in the second region A2, where H3+H2=H1. Consequently, the surface of the third planarization sublayer 33 facing away from the substrate 1 is flush with the surface of the first planarization sublayer 31 facing away from the substrate 1, which facilitates subsequent preparation of the light-emitting unit layer 4 formed above the third planarization sublayer 33 and the first planarization sublayer 31. Subsequently, the light-emitting unit layer 4 may be continuously formed above the first planarization sublayer 31 and the second planarization sublayer 32 to form the display panel having the structure as illustrated in FIG. 10.

The above description of the structure of the display panel is made with reference to an example that the second planarization sublayer 32 is arranged on the side of the third planarization sublayer 33 close to the driving circuit layer 2. In another embodiment shown in FIG. 12, which is another schematic sectional view according to embodiments of the present disclosure, the third planarization sublayer 33 may be arranged on the side of the second planarization sublayer 32 close to the driving circuit layer 2. When the display panel is bent, the light-emitting unit layer 4 is commonly arranged at a neutral surface of the display panel, in order to ensure that the display effect of the display panel in the folded state is not affected. The third planarization sublayer 33 having a larger distance from the light-emitting unit layer 4 has a smaller elasticity modulus as compared with the second planarization sublayer 32. Therefore, with the arrangement manner according to embodiments of the present disclosure, if the second region A2 is affected by the bending stress during the bending process, the third planarization sublayer 33 is easier to relieve the stress during the bending process, which is beneficial to ensure the bending reliability of the second region A2.

Figure 12:
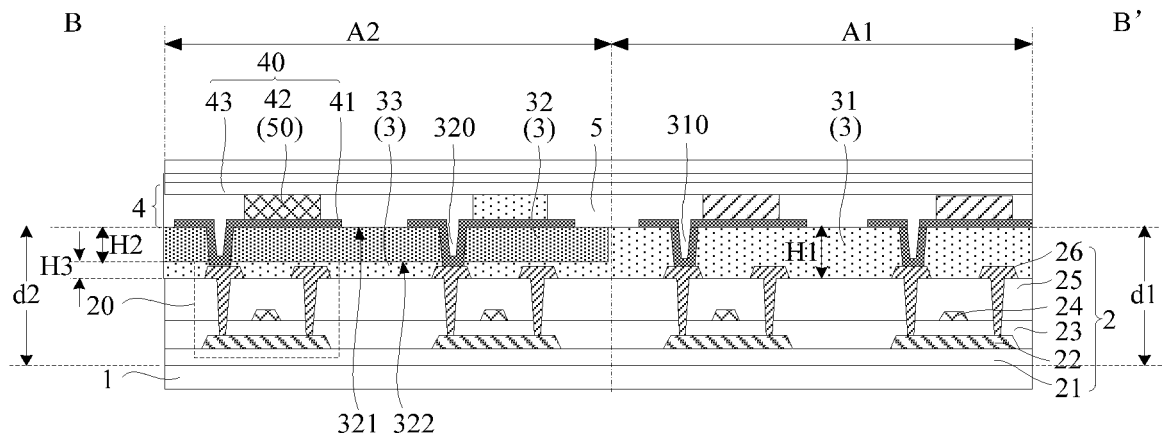
FIG. 12 is another schematic sectional view taken along line BB' in FIG. 1, according to an embodiment of the present disclosure.

Referring to FIG. 12, the second planarization sublayer 32 includes the first surface 321 and the second surface 322 that are opposite to each other in the thickness direction of the substrate 1, and the second surface 322 is located on the side of the first surface 321 close to the driving circuit layer 2. An area of the orthographic projection of the first surface 321 on the plane of the substrate 1 may be equal to an area of the orthographic projection of the second surface 322 on the plane of the substrate 1. That is, a sectional shape of the second planarization sublayer 32 is a rectangular-like shape, and the bottom edge of the second planarization sublayer 32 is perpendicular to the side edges thereof.

Figure 13:
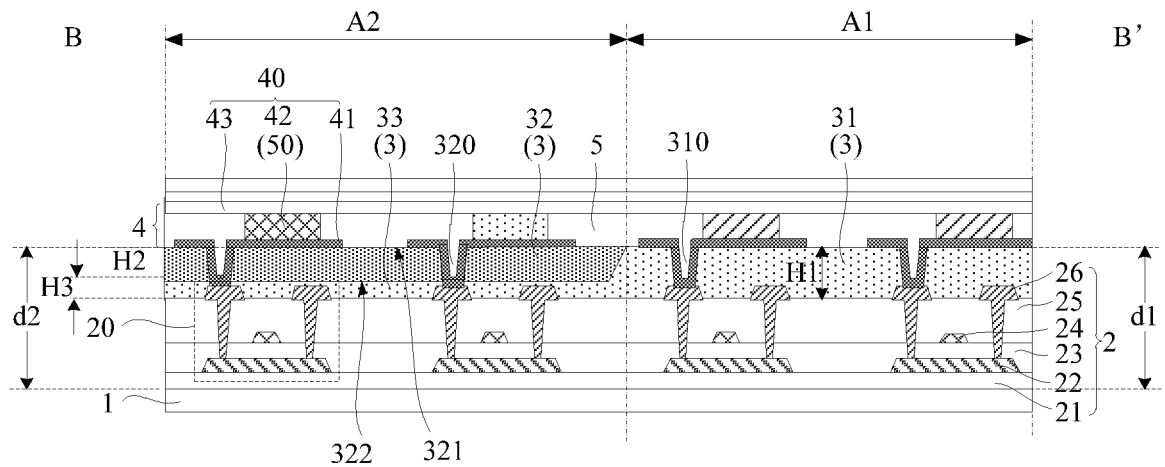
FIG. 13 is another schematic sectional view taken along line BB' in FIG. 1, according to an embodiment of the present disclosure.

In an embodiment of the present disclosure as illustrated in FIG. 13, which is another schematic sectional view taken along line BB' in FIG. 1, the area of the orthographic projection of the first surface 321 on the plane of the substrate 1 may be greater than the area of the orthographic projection of the second surface 322 on the plane of the substrate 1. Referring to FIG. 13, the orthographic projection of the second planarization sublayer 32 on the plane of the substrate 1 covers the orthographic projection of the third planarization sublayer 33 on the plane of the substrate. This arrangement is configured in a manner that the second planarization sublayer 32 formed above the third planarization sublayer 33 may cover the third planarization sublayer 33, so that the second region A2 may have improved display effect and good mechanical performance, and the contact area between the second planarization sublayer 32 and the third planarization sublayer 33 may be increased to reduce possibility of peeling between the second planarization sublayer 32 and the third planarization sublayer 33.

Referring to FIG. 12 and FIG. 13, the distance between the surface of the first planarization sublayer 31 facing away from the substrate 1 and the substrate 1 is d1 at any position in the first region A1, and the distance between the surface of the second planarization sublayer 32 facing away from the substrate 1 and the substrate 1 is d2 at any position in the second region A2, where d1=d2. With this arrangement, the entire surface formed by the first planarization sublayer 31, the second planarization sublayer 32 and the third planarization sublayer 33 in the first region A1 and the second region A2 is flat. While ensuring that the first region A1 and the second region A2 do not have color offset during display and improving the display effect of the first region A1 and the second region A2, the same process may be adopted to form the light-emitting units 40 in the first region A1 and the second region A2 respectively, and the manufacturing process of the display panel may be thus simplified.

Figure 14:
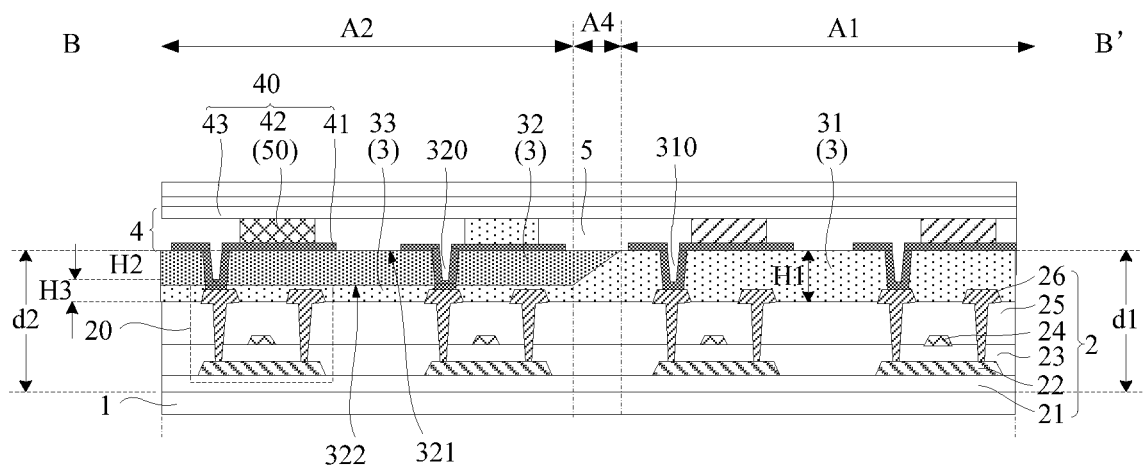
FIG. 14 is another schematic sectional view taken along line BB' in FIG. 1, according to an embodiment of the present disclosure.

In an embodiment, as illustrated in FIG. 14, which is another schematic sectional view taken along line BB' in FIG. 1, a transition region A4 is provided between the first region A1 and the second region A2 according to embodiments of the present disclosure. The transition region A4 includes the first planarization sublayer 31. When the first region A1 is a bendable region of the display panel, during the bending operation of the display panel, the bending stress may also act on a film layer in a region adjacent to the first region A1, except for acting on the film layers in the first region A1. According to embodiments of the present disclosure, the transition region A4 is provided between the first region A1 and the second region A2, such that the bending stress between the first region A1 and the second region A2 may be relieved, and the second region A2 cannot be affected by the stress in the folded state, thereby avoiding poor display of the display panel. For example, the light-emitting unit 40 may not be provided in the transition region A4.

Referring to FIG. 14, the transition region A4 further includes the second planarization sublayer 32. The first planarization sublayer 31 and the second planarization sublayer 32 are stacked in the transition region A4. In addition, a thickness of a portion of the first planarization sublayer 31 in the transition region A4 is greater than or equal to a thickness of a portion of the first planarization sublayer 31 in the second region A2, and the thickness of the portion of the first planarization sublayer 31 in the transition region A4 is smaller than or equal to a thickness of a portion of the first planarization sublayer 31 in the first region A1. A thickness of a portion of the second planarization sublayer 32 in the transition region A4 is smaller than or equal to a thickness of a portion of the second planarization sublayer 32 in the second region A2. Furthermore, along a direction from the first region A1 toward the second region A2, the thickness of the portion of the first planarization sublayer 31 in the transition region A4 gradually decreases, and the thickness of the portion of the second planarization sublayer 32 in the transition region A4 gradually increases.

When the first planarization sublayer 31 and the second planarization sublayer 32 are arranged in the transition region A4, as illustrated in FIG. 14, the first planarization sublayer 31 may be provided on the side of the second planarization sublayer 32 close to the driving circuit layer 2 according to embodiments of the present disclosure. In this case, the first planarization sublayer 31 located in the first region A1, the second region A2, and the transition region A4 may be formed by using a half-gray scale mask having regions with different light transmittances during a same process. After the first planarization sublayer 31 is formed, the second planarization sublayer 32 located in the second region A2 and the transition region A4 is formed by using another half-gray scale mask during a same process.

Figure 15:
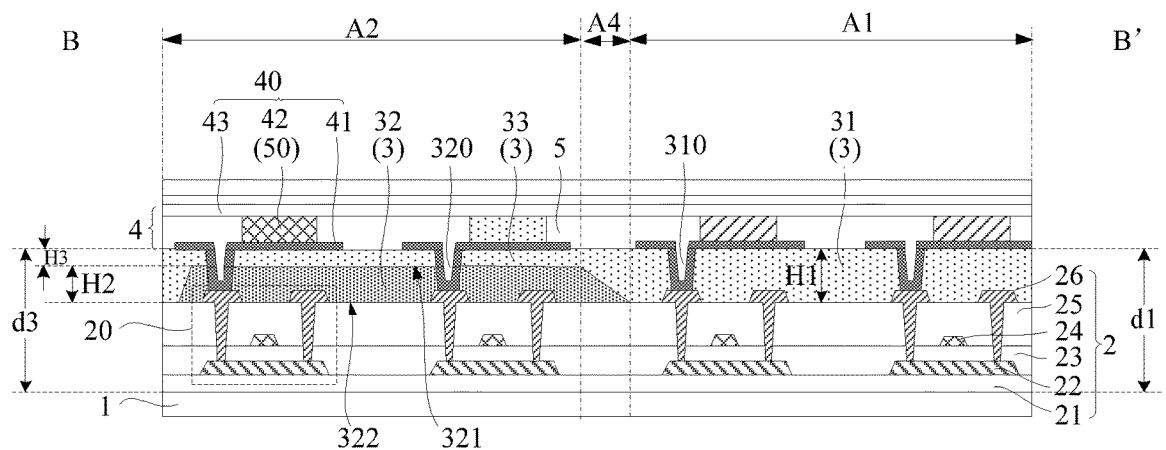
FIG. 15 is another schematic sectional view taken along line BB' in FIG. 1, according to an embodiment of the present disclosure.

Alternatively, as illustrated in FIG. 15, it is another schematic sectional view taken along line BB' in FIG. 1. In the transition region A4, the second planarization sublayer 32 may also be arranged on the side of the first planarization sublayer 31 close to the driving circuit layer 2 according to embodiments of the present disclosure. In this case, the second planarization sublayer 32 located in the second region A2 and the transition region A4 may be formed by using a half-gray scale mask having regions with different light transmittances during a same process. After the second planarization sublayer 32 is formed, the first planarization sublayer 31 located in the first region A1, the second region A2, and the transition region A4 is formed by using another half-gray scale mask during a same process.

In an embodiment, according to embodiments of the present disclosure, a length X of the transition region A4 satisfies a condition of $0<X\leq 5$ mm in the direction from the first region A1 toward the second region A2. Such an arrangement ensures that the bending stress between the first region A1 and the second region A2 is effectively relieved so as to ensure that the second region A2 shall not be affected by the stress in the folded state, and also guarantees that an area of the second region A2 shall not be too small, thereby effectively ensuring the area of the display region of the display panel.

The display panel uses the first region A1 as the bendable region of the display panel as an example, as described hereinbefore. When the display panel is configured to have other functions, for example, when the display panel has a camera or fingerprint identification function, the first region A1 may be a region of the display panel that is provided with a functional module such as a camera or fingerprint identification unit, and the second region A2 may be a region of the display panel that is not provided with the above functional module. In this case, according to embodiments of the present disclosure, the materials of the first planarization sublayer 31 and the second planarization sublayer 32 may be different in composition. For example, a material with a higher light transmittance may be selected to form the first planarization sublayer 31, and a material with a relatively smaller light transmittance may be selected to form the second planarization sublayer 32, so as to increase intensity of light incident to the functional module through the first planarization sublayer 31, and to ensure that the functional module has a good lighting effect.

Figure 16:
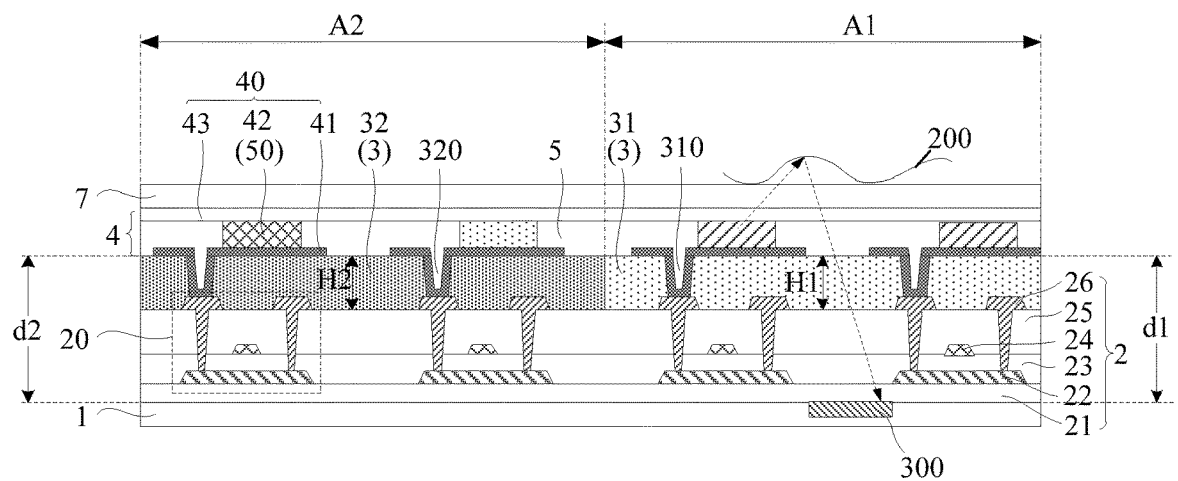
FIG. 16 is a schematic sectional view of another display panel according to an embodiment of the present disclosure.

Referring to FIG. 16, which is another schematic sectional view of the display panel according to embodiments of the present disclosure, the first region A1 includes a fingerprint identification unit 300. When fingerprint identification is performed on the display panel, the light-emitting units 40 of the display panel may be used as a light source for fingerprint identification during the fingerprint identification. The light source emits light that is directed toward a finger 200 and then reflected by the finger 200 to the fingerprint identification unit 300 for the fingerprint identification. Since the light transmittance of the first planarization sublayer 31 is relatively high, such an arrangement may reduce loss of reflected light in a process of being transmitted to the fingerprint identification unit 300, and increase intensity of light incident to the fingerprint identification unit 300, thereby ensuring sensitivity of fingerprint identification.

Figure 17:
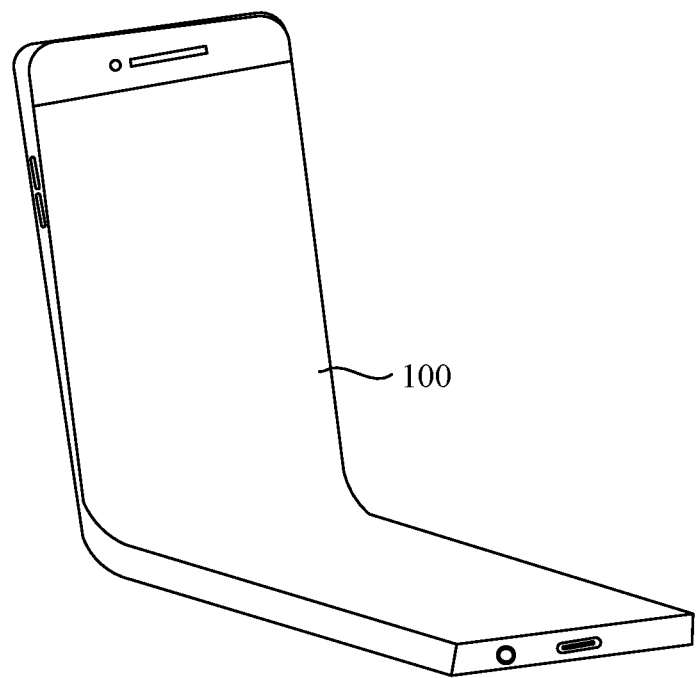
FIG. 17 is a schematic diagram of a display device according to an embodiment of the present disclosure.

Embodiments of the present disclosure also provide a display device. Referring to FIG. 17, which is a schematic diagram of a display device according to an embodiment of the present disclosure, the display device includes the above display panel 100. The specific structure of the display panel 100 has been described in detail in the above embodiments, and will not be repeated herein. Further, the display device illustrated in FIG. 17 is only for schematic illustration. The display device may be any electronic device with a display function, such as a mobile phone, a tablet computer, a notebook computer, an electronic paper book, or a television.

The above are only some embodiments of the present disclosure and are not intended to limit the present disclosure. Any modification, equivalent replacement, improvement, etc., made within the spirit and principle of the present disclosure shall be included within the scope of the present disclosure.

What is claimed is:

1. A display panel, comprising:
    a bendable region and a non-bendable region;
    a substrate;
    a driving circuit layer disposed on a side of the substrate;
    a planarization layer disposed on a side of the driving circuit layer facing away from the substrate and comprising a first planarization sublayer and a second planarization sublayer, wherein the first planarization sublayer is arranged at least in the bendable region, the second planarization sublayer is arranged at least in the non-bendable region, and a material of the first planarization sublayer and a material of the second planarization sublayer are different in composition, and wherein the first planarization sublayer and the second planarization sublayer do not overlap each other along a thickness direction of the substrate; and
    a light-emitting unit layer provided on a side of the planarization layer facing away from the driving circuit layer,
    wherein the planarization layer further comprises a third planarization sublayer arranged in the non-bendable region and stacked with the second planarization sublayer, a thickness of the first planarization sublayer is equal to a sum of a thickness of the second planarization sublayer and a thickness of the third planarization sublayer, and a material of the third planarization sublayer and the material of the first planarization sublayer comprise same composition.

2. The display panel of claim 1, wherein an elasticity modulus of the first planarization sublayer is smaller than an elasticity modulus of the second planarization sublayer.

3. The display panel of claim 2, wherein the elasticity modulus of the first planarization sublayer is defined as E1, where E1≤3.5 GPa; and
    wherein the elasticity modulus of the second planarization sublayer is defined as E2, where E2≤4.5 GPa.

4. The display panel of claim 1, wherein along the thickness direction of the substrate, the thickness of the second planarization sublayer is smaller than or equal to the thickness of the first planarization sublayer.

5. The display panel of claim 1, wherein the second planarization sublayer is arranged on a side of the third planarization sublayer adjacent to the driving circuit layer.

6. The display panel of claim 5, wherein the second planarization sublayer comprises a first surface and a second surface that are opposite to each other in the thickness direction of the substrate, and wherein the second surface is disposed on a side of the first surface adjacent to the driving circuit layer; and
    wherein an area of an orthographic projection of the first surface on a plane of the substrate is smaller than or equal to an area of an orthographic projection of the second surface on the plane of the substrate.

7. The display panel of claim 5, wherein an orthographic projection of the third planarization sublayer on a plane of the substrate covers an orthographic projection of the second planarization sublayer on the plane of the substrate.

8. The display panel of claim 1, wherein the third planarization sublayer is arranged on a side of the second planarization sublayer adjacent to the driving circuit layer.

9. The display panel of claim 8, wherein the second planarization sublayer comprises a first surface and a second surface that are opposite to each other in the thickness direction of the substrate, and the second surface is located on a side of the first surface close to the driving circuit layer; and
    wherein an area of an orthographic projection of the first surface on a plane of the substrate is greater than or equal to an area of an orthographic projection of the second surface on the plane of the substrate.

10. The display panel of claim 8, wherein an orthographic projection of the second planarization sublayer on a plane of the substrate covers an orthographic projection of the third planarization sublayer on the plane of the substrate.

11. The display panel of claim 1, wherein along the thickness direction of the substrate, the thickness of the first planarization sublayer is smaller than or equal to 6 μm.

12. The display panel of claim 1, wherein the non-bendable region comprises a first non-bendable region and a second non-bendable region that are spaced apart by the bendable region.

13. The display panel of claim 12, wherein the light-emitting unit layer comprises a plurality of light-emitting units, and at least one light-emitting unit of the plurality of light-emitting units is arranged in the bendable region.

14. The display panel of claim 1, wherein the first planarization sublayer comprises polyimide, and wherein the second planarization sublayer comprises silicone resin.

15. The display panel of claim 1, wherein the driving circuit layer comprises a plurality of thin film transistors, wherein source electrodes and drain electrodes of the plurality of thin film transistors are arranged in a metal layer, and wherein the first planarization sublayer and the second planarization sublayer are both in contact with the metal layer.

16. A display device, comprising a display panel, wherein the display panel comprises:
    a bendable region and a non-bendable region;
    a substrate;
    a driving circuit layer disposed on a side of the substrate;
    a planarization layer disposed on a side of the driving circuit layer facing away from the substrate and comprising a first planarization sublayer and a second planarization sublayer, wherein the first planarization sublayer is arranged at least in the bendable region of the display panel, the second planarization sublayer is arranged at least in the non-bendable region of the display panel, and a material of the first planarization sublayer and a material of the second planarization sublayer are different in composition, and wherein the first planarization sublayer and the second planarization sublayer do not overlap each other along a thickness direction of the substrate; and
    a light-emitting unit layer provided on a side of the planarization layer facing away from the driving circuit layer,
    wherein the planarization layer further comprises a third planarization sublayer arranged in the non-bendable region and stacked with the second planarization sublayer, a thickness of the first planarization sublayer is equal to a sum of a thickness of the second planarization sublayer and a thickness of the third planarization sublayer, and a material of the third planarization sublayer and the material of the first planarization sublayer comprise same composition.

17. A display panel, comprising:
a bendable region and a non-bendable region;
a substrate;
a driving circuit layer disposed on a side of the substrate;
a planarization layer disposed on a side of the driving circuit layer facing away from the substrate and comprising a first planarization sublayer and a second planarization sublayer, wherein the first planarization sublayer is arranged at least in the bendable region, the second planarization sublayer is arranged at least in the non-bendable region, and a material of the first planarization sublayer and a material of the second planarization sublayer are different in composition, and wherein the first planarization sublayer and the second planarization sublayer do not overlap each other along a thickness direction of the substrate; and
a light-emitting unit layer provided on a side of the planarization layer facing away from the driving circuit layer,
wherein the non-bendable region comprises a first non-bendable region and a second non-bendable region that are spaced apart by the bendable region, and
wherein the light-emitting unit layer comprises a plurality of light-emitting units, and at least one light-emitting unit of the plurality of light-emitting units is arranged in the bendable region.

18. The display panel of claim 17, wherein an elasticity modulus of the first planarization sublayer is smaller than an elasticity modulus of the second planarization sublayer.

19. A display device comprising the display panel according to claim 17.

* * * * *